(12) United States Patent
Vitiello et al.

(10) Patent No.: US 11,189,486 B2
(45) Date of Patent: Nov. 30, 2021

(54) METHOD FOR DEPOSITING AN INSULATING MATERIAL INTO A VIA

(71) Applicant: KOBUS SAS, Montbonnot-Saint-Martin (FR)

(72) Inventors: Julien Vitiello, Grenoble (FR); Fabien Piallat, Montbonnot-Saint-Martin (FR)

(*) Notice: Subject to any disclaimer, the term of this patent is extended or adjusted under 35 U.S.C. 154(b) by 81 days.

(21) Appl. No.: 16/633,086

(22) PCT Filed: Jul. 31, 2018

(86) PCT No.: PCT/EP2018/070806
§ 371 (c)(1),
(2) Date: Jan. 22, 2020

(87) PCT Pub. No.: WO2019/042687
PCT Pub. Date: Mar. 7, 2019

(65) Prior Publication Data
US 2020/0234951 A1    Jul. 23, 2020

(30) Foreign Application Priority Data
Aug. 29, 2017 (FR) ...................... 1757951

(51) Int. Cl.
*H01L 21/02* (2006.01)
*C23C 16/505* (2006.01)
*C23C 16/455* (2006.01)

(52) U.S. Cl.
CPC .. *H01L 21/02274* (2013.01); *C23C 16/45553* (2013.01); *C23C 16/505* (2013.01); *H01L 21/0228* (2013.01); *H01L 21/02219* (2013.01)

(58) Field of Classification Search
None
See application file for complete search history.

(56) References Cited

U.S. PATENT DOCUMENTS

| 7,972,980 B2 | 7/2011 | Lee et al. |
| 2013/0171834 A1 | 7/2013 | Haverkamp et al. |

(Continued)

FOREIGN PATENT DOCUMENTS

| WO | 2009136019 | 11/2009 |
| WO | 2015126590 | 8/2015 |
| WO | 2015140261 | 9/2015 |

*Primary Examiner* — Asok K Sarkar
(74) *Attorney, Agent, or Firm* — Burr & Forman LLP; Harvey S. Kauget

(57) ABSTRACT

A method for depositing a layer of a material onto a substrate, comprising: one gas-phase injection of a first chemical species with a precursor of such insulating material, into a deposition chamber of a chemical vapor deposition reactor, through a first injection path, according to a first pulse sequence; one gas-phase injection of a second chemical species with a reactant adapted to react with such precursor, into the deposition chamber, through a second injection path, according to a second pulse sequence which is phase-shifted relative to the first pulse sequence; one sequential generation of a plasma of the first chemical species and/or the second chemical species during at least one pulse of at least one of the first and second sequences, with such plasma being generated from a high frequency (HF) plasma source and a low frequency (LF) plasma source applied to the first and second injection paths, the low frequency (LF) plasma source power on the high frequency (HF) plasma source power ratio being above 1.

18 Claims, 2 Drawing Sheets

(56) References Cited

U.S. PATENT DOCUMENTS

| | | | |
|---|---|---|---|
| 2014/0113457 A1* | 4/2014 | Sims | C23C 16/045 |
| | | | 438/792 |
| 2015/0179437 A1* | 6/2015 | Li | H01L 21/02274 |
| | | | 438/792 |
| 2021/0005515 A1* | 1/2021 | Yu | H01L 21/76846 |

* cited by examiner

METHOD FOR DEPOSITING AN INSULATING MATERIAL INTO A VIA

FIELD OF THE INVENTION

The present invention relates to a method for depositing an insulating (i.e. dielectric) material into a via, more precisely a «Through Silicon Via».

Such deposition method is a special implementation of one method for injecting chemical species in a gaseous condition, for applications such as a gas deposition of one layer onto a substrate in a reactor.

BACKGROUND OF THE INVENTION

Various manufacturing or surface treatment methods consist in steps of sequentially injecting gaseous reactants into a reactor. This results in injecting reactants, in pulse sequences, as opposed to the continuous injection of reactants into the reactor. Such pulsed injections make it possible to have a greater control on the quantity of introduced reactive elements, on the duration of contact between the various reactants, as well as on the retention time thereof in the reactor.

Among the methods which use pulsed injections of reactants, the «Chemical Vapor Deposition», also designated by the acronym CVD can be mentioned.

Such method consists in depositing some solid material as a thin layer onto the surface of a substrate previously positioned in a reactor chamber, from gaseous chemical species.

The applications more particularly relate to substrates for micro-electronics. One CVD method, wherein the reactants are injected into the reactor in pulse sequences is disclosed in document WO 2015/140261. This document discloses the injection of two reactants in gaseous phase into one reactor according to one pulse sequence per reactant, with the two pulse sequences being phase-shifted. Such a method is known as a pulsed CVD method.

When implementing most of these methods, the reactor chamber must be heated to high temperatures, often above 300° C. or even 350° C., in order to supply the activation energy required for triggering the chemical reactions, and for reaching satisfactory reaction rates. This is more specifically the case for CVD methods such as the one disclosed in document WO 2015/140261.

However, for some applications, more particularly depending on the substrate nature and the resistance thereof to temperatures, the deposition operations have to be carried out at temperatures below temperatures which would be ideal or required for triggering chemical reactions, such as 200° C., for instance.

Sufficient energy for the reaction system is wanted at temperatures lower than the usual or ideal activation temperatures for chemical reactions, so as to enable the execution of these reactions in good conditions and at temperatures which limit the risk of damages to the substrate.

One of the concerned applications relates to Through Silicon Vias (TSV). TSVs require the deposition of a dielectric (an insulating material) liner prior to being metallized, for instance. The thickness of the liner should be as uniform as possible, as this is for instance documented in WO2015126590 and U.S. Pat. No. 7,972,980.

Depending on the selected integration, and specifically with the TSV last type integration, after the deposition of the insulating layer, the bottom of the via has to be etched to eliminate the insulating layer which has just been deposited, and to recreate contact with the metal under the via.

Limiting the thickness of the deposit on the bottom of the via is thus interesting, in order to more specifically reduce the duration of the etching step which may damage the material deposited on the walls and the top of the via.

The present deposition techniques do not make it possible to obtain a "break" in the thickness laid at the bottom of the via and thus require significant etching during the subsequent steps to create contact with the metal present under the via.

BRIEF DESCRIPTION OF THE INVENTION

The aim of the present invention is thus to remedy the drawbacks of the prior art by proposing a method for depositing a layer of one insulating material onto a substrate provided with vias, which makes it possible to limit the thickness of the deposit on the bottom of the via.

For this purpose, the aim of the invention is a method for depositing a layer of insulating material onto a substrate, and more particularly, when said substrate comprises a via, into one via of said substrate, which comprises:

a gas-phase injection of a first chemical species comprising a precursor of said insulating material, into a deposition chamber of a chemical vapor deposition reactor, through a first injection path, according to a first pulse sequence;
  a gas-phase injection of a second chemical species comprising a reactant adapted to react with said precursor, into the deposition chamber, through a second injection path (which is different from the first injection path), according to a second pulse sequence which is phase-shifted relative to the first pulse sequence;
  a sequential generation of a plasma of the first chemical species and/or the second chemical species during at least one pulse of at least one of the first and second sequences, with such plasma being generated from a high frequency (HF) plasma source and a low frequency (LF) plasma source, with said high frequency (HF) plasma source and a low frequency (LF) plasma source being applied to the first and second injection paths, the low frequency (LF) plasma source power on the high frequency (HF) plasma source power ratio being above 1.

The method according to the invention thus makes it possible to obtain both a conformal deposition (i.e. the thickness of the formed layer being constant or substantially constant) on the edges and the inner walls of the via and a deposition having a low thickness (or at least having a thickness smaller than that of the deposition on the walls) at the bottom of the via. Limiting the thickness at the bottom of the via makes it possible to reduce, for instance the need for etching the bottom of the via in order to eliminate the insulating layer, and to limit the damages entailed in etching at the top of the via, prior to a subsequent step of depositing metal, for example.

Such type of thickness profile in a via cannot be obtained using the other techniques such as PECVD («Plasma Enhanced Chemical Vapor Deposition») and ALD («Atomic Layer Deposition»), since PECVD has a conformality limited to 10-20% for aspect ratios >10:1, whereas ALD, because of the surface saturation principle, does not make it possible to change the conformality, which is almost 100%, with thickness being identical on all the surfaces of a via.

Pressure in the chamber may advantageously range from 500 mTorr (about 66 Pa) to 10 Torr (about 1,333 Pa), or, preferably, from 500 mTorr (about 66 Pa) to 2 Torr (about 266 Pa).

The precursor flow preferably ranges from 20 mgm (milligrams per minute) to 100 mgm.

The total flow of the injected chemical species is preferably less than 1,000 sccm («standard cubic centimeter per minute»).

In one particular implementation of the deposition method according to the invention, plasma is generated pulse-wise in the deposition chamber during the injection of the first chemical species and/or of the second chemical species.

It can also be expected that one of the following conditions will be met:
   The duration of one pulse of the first pulse sequence and/or of the second pulse sequence ranges from 0.02 s to 5 s;
   The time interval between the first pulse sequence and/or of the second pulse sequence may advantageously range from 0.02 s to 10 s; Plasma can be generated during the whole pulse duration of at least one of the first and second sequences.

The duration of each plasma pulse can be so chosen as to be less than 1 second. The high frequency plasma source may present a frequency comprised between 12 and 15 MHz. The low frequency plasma source may present a frequency comprised between 100 and 600 kHz.

As regards the deposition method according to the invention, the precursor can belong to the metal-organic family. It can comprise at least one of the following compounds: tetraethyl orthosilicate (TEOS), bis(tert-butylamino)silane (BTBAS), bis(di-butylamino)silane (BDBAS), Tetrakis Diethylamido Titane (TDEAT), Tert-Butylimido Tris(DiEthylamino) Tantale (TBTDET), Trimethylaluminum (TMA), diethylzinc (DEZ).

The reactant comprises at least one of the following compounds: steam ($H_2O$), dinitrogen oxide ($N_2O$), gaseous oxygen ($O_2$), ammonia ($NH_3$), methane ($CH_4$).

The method according to the invention can more specifically be applied to form a layer of an insulating material into a via of a substrate, the via being defined by two opposing walls and a bottom, so as to deposit a layer with a greater thickness on the walls of said via than on the bottom of said via.

DESCRIPTION OF THE FIGURES

Other characteristics and advantages of the invention will appear upon reading the following description given by way of a non-restrictive example while referring to the appended FIGS. 1 to 3 wherein.

DETAILED DESCRIPTION OF THE INVENTION

The injection method implemented in the deposition method according to the invention consists in injecting gaseous chemical species into an enclosure, such as the reaction chamber of a reactor, for instance, according to pulse sequences, with plasma generation.

A first step of the injection method consists in injecting a first gaseous chemical species into the enclosure according to a first pulse sequence. Another step of the injection method consists in injecting a second gaseous chemical species into the enclosure according to a second pulse sequence.

The first chemical species is preferably injected through a first injection path, and the second chemical species is injected through a second injection path, which is different from the first injection path. By injecting the first and second chemical species through different injection paths, the reaction of one species with the other is prevented before they are actually present into the reaction chamber.

The first pulse sequence and the second pulse sequence are phase-shifted, i.e. successive moments exist, during the injection method, during which the first chemical species only is injected into the enclosure and moments during which the second chemical species only is injected into the enclosure. Pulses of the first and second sequence do not perfectly overlap. Some moments may also exist during which both chemical species are simultaneously injected and/or moments during which no chemical species is injected into the enclosure.

The so injected chemical species are then intended to react together and/or with a third chemical species which may initially be present in the enclosure or brought during or after the injection of the chemical species concerned.

The injected chemical species are also intended to react with the free surface of a substrate, with the latter being for instance a substrate on the surface of which a solid layer for semi-conductor has to be provided.

The separate management of the injection of the first and second chemical species according to a phase-shifted mode of said first and second chemical species favours the reaction thereof on the free surface of the substrate rather than in the space between the free surface of the substrate and the system of injection, or rather than with other chemical species initially present on the surface of the substrate.

Figure 1:
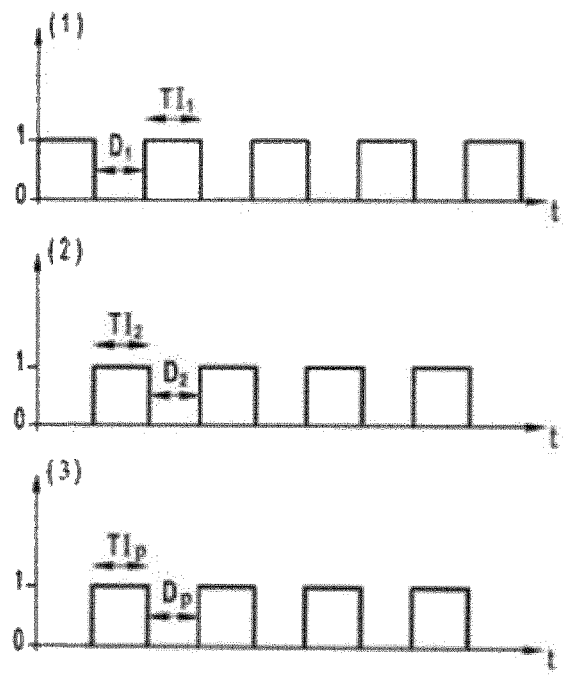
FIG. 1 is a schematic diagram of pulse sequences according to one embodiment of the method according to the invention.

FIG. 1 gives one example of the first pulse sequence, noted 1, and the second pulse sequence, noted 2, of the injection of the chemical species. The first pulse sequence and the second pulse sequence are shown as time periods vs time t. It shall be noted that the present invention is not limited to such embodiment.

While referring to FIG. 1, a chemical species is injected into the enclosure when the time interval is equal to 1, and such time interval then corresponds to one pulse.

The duration of one pulse then corresponds to the time for which one chemical species is injected into the enclosure.

The time between two successive pulses of one pulse sequence is called the "time interval" and corresponds to a period of time during which the chemical species is not injected into the enclosure.

Then, for the first pulse sequence 1, the following terms can be defined:
   the duration of one pulse of the first pulse sequence: TI1
   the time interval between two successive pulses of the first pulse sequence: D1.

Similarly, for the second pulse sequence 2, the following terms can be defined:
   the duration of one pulse of the second pulse sequence: TI2
   the time interval between two successive pulses of the second pulse sequence: D2.

Phase-shift between the first pulse sequence and the second pulse sequence can be adjusted, specifically according to the reactivity of the first chemical species with the second chemical species.

When the first pulse sequence and the second pulse sequence overlap, the adjustment of the phase shift is equivalent to the adjustment of the degree of overlapping of the two pulse sequences.

As a matter of fact, the higher the reactivity between the first chemical species and the second chemical species is, the greater phase-shift should be. The overlapping between the pulses of the first pulse sequence and the pulses of the second pulse sequence (i.e. the moments when the two chemical species are simultaneously injected) shall then have to be minimized, and preferably eliminated, in case of high reactivity between the first and the second chemical species. For instance, the degree of overlap between pulses of the sequences could be selected to be less than 50% of the longest of the two pulses, or less than 20%, or 10% or even equal to 0% of the longest of the two pulses.

Besides, it may be advantageous to consider some time interval between two successive pulses of a sequence of injection of one species which is longer than the duration of the pulse of injection of the other species, i.e. for instance D1 longer than TI2, and/or D2 longer than TI1. A high reactivity between the first chemical species and the second chemical species will favour the reaction between said first and second chemical species on the free surface of the substrate.

Such configuration of the method makes it possible to minimize the parasitic reaction in the space between the free surface of the substrate and the chemical compounds injection system.

The first sequence of pulses may be periodic and have a first period.

The second sequence of pulses may also be periodic and have a second period.

The first period and the second period may be equal.

Repeating the first and second pulse sequences may define injection cycles of the first and second chemical species.

According to specific implementations of the deposition method according to the invention:
  The duration TI1 of one pulse of the first pulse sequence can range from 0.02 s to 5 s;
  The time interval D1 between two pulses of the first pulse sequence can range from 0.02 s to 10 s.
  The duration TI2 between two pulses of the second pulse sequence can range from 0.02 s to 5 s.
  The time interval D2 between two pulses of the second pulse sequence can range from 0.02 s to 10 s.
  According to other embodiments:
  The duration TI1 of one pulse of the first pulse sequence and/or the duration TI2 of one pulse of the second pulse sequence can respectively range from 0.02 s to 1 s;
  The time interval D1 between two pulses of the first pulse sequence and the time interval D2 between two pulses of the second pulse sequence may respectively range from 0.02 s to 1s; According to other embodiments:
  The duration TI1 of one pulse of the first pulse sequence and the duration TI2 of one pulse of the second pulse sequence can respectively range from is to 5 s;
  The time interval D1 between two pulses of the first pulse sequence and the time interval D2 between two pulses of the second pulse sequence may respectively range from is to 10 s;

By definition, a plasma corresponds to the excited or ionized condition of a gas further to a transfer of electrical energy, from a source of electrical energy to the gaseous medium. Gaseous plasma can be obtained by using methods known to the persons skilled in the art, such as, for example, energy supply from a high frequency electrical source (presenting a frequency greater than 1 Mhz, comprised for instance between 12 Mhz and 15 Mhz, such as 13.56 MHz), or a low frequency electrical source (presenting a frequency smaller than 1 Mhz, comprised for instance from 100 to 600 kHz), or using an electrical discharge between two electrodes. The power brought by the electrical source generally ranges from 10 to 3,000 W for a high frequency or a low frequency source.

Now, when a chemical species is injected into one enclosure, it receives electrical energy from the source provided for this purpose, and switches to a ionized, so-called plasma, condition. Such source can be activated or not during the injection of the chemical species, so as to sequentially form a plasma with such chemical species at a predetermined moment. The injection method according to the invention consists in injecting a first and a second chemical species through the respective injection paths thereof, according to the respective pulse sequences thereof, with such pulses being phase-shifted with respect to each other, while sequentially generating, for instance as a pulse sequence, a plasma of the first and/or second chemical species, during at least one pulse of at least one of the injection sequences thereof. Such plasma comprises both a low frequency and a high frequency component.

A plasma pulse is generated by activating the electrical sources for a limited period of time, which corresponds to the width of the pulse. The generation of «plasma pulses» or «sequentially generated plasma» comprises steps of generating pulses with the high and low frequency electrical source.

«During at least on pulse of at least one of the injection sequence thereof», means that plasma can be generated during at least a part of the pulse, but not out of the pulse of the first and/or second chemical species. The pulse sequence of plasma and the pulse sequence of the first and/or second chemical species can thus partially or totally overlap.

Plasma is preferably generated for the whole duration of one pulse of at least one of the injection sequences of the first and/or second chemical species.

Plasma is preferably not generated when no chemical species is injected, i.e. between pulses of the first and the second species, so as to avoid a risk of electrical breakdown in the reactor.

Besides, the method can comprise an initial step of injecting the first chemical species and/or the second chemical species according to one or more sequence(s) of pulses with no generation of plasma, with the plasma assistance being implemented during a subsequent step of the injection method only.

According to one embodiment of the injection method according to the invention, plasma is generated pulse-wise during the injection of the first chemical species and/or the second chemical species, through a plasma pulse sequence. This is known as pulse plasma.

Plasma is generated pulse-wise in the enclosure, during the injection of the first chemical species and/or the second chemical species.

One example of the plasma pulse sequence is shown in FIG. 1, with reference number 3. This example shows the first embodiment of the injection method wherein plasma is generated pulse-wise.

Similarly for sequences 1 and 2, the following terms are defined as follows for sequence 3 of plasma:
  the duration of one plasma pulse: TIp a time interval between two successive plasma pulses: Dp.

In the specific example of the plasma sequence 3, the pulses of plasma correspond to the pulses of the sequence 2 of injection of the second chemical species. The duration TIp thus corresponds to the duration TI2, and the time interval Dp corresponds to the time interval D2.

For instance,

The duration TIp of one plasma pulse may range from 0.02 s to 5 s, and the time interval Dp between two plasma pulses may range from 0.02 s to 10 s;

The duration TIp of one plasma pulse may range from 0.02 s to 1 s, and the time interval Dp between two plasma pulses may range from 0.02 s to 1 s;

The duration TIp of one plasma pulse may range from 1 s to 5 s, and the time interval Dp between two plasma pulses may range from is to 10 s; According to other embodiments:

The plasma pulses may correspond to the pulses of the sequence 1 of injection of the first chemical species. The duration TIp thus corresponds to the duration TI1, and the time interval Dp corresponds to the time interval D1.

The plasma pulses may successively correspond to the pulses of the sequence 1 of injection of the first chemical species and to the plasma pulses of the sequence 2 of injection of the second chemical species. In this case, two plasma pulses are applied within one injection cycle.

The main idea of the deposition method according to the invention is based on the following formula, which is known to the persons skilled in the art:

$$\lambda_D = 743 \sqrt{\frac{T_e}{n_e}}$$

with $\lambda_D$ being the Debye length of the system, corresponding to the mean free path distance of the activated species, $T_e$ being the temperature of electrons in the system and $n_e$ being the electronic density of the system (number of free electrons in the system).

Now the persons skilled in the art know the following proportionality:

$$T_e(eV) \propto \frac{Power\ (W)}{Pressure(Torr)}$$

and $$n_e(m^{-3}) \propto \frac{Excitation\ frequency(Hz)}{retention\ time\ (s)}$$

the result is thus:

$$\lambda_D \propto \frac{Power\ (W) \times Retention\ time\ (s)}{Pressure(Torr) \times Excitation\ frequency(Hz)}$$

For a better understanding of notions on Debye length, reference can be usefully made to the article published by M. Lieberman, A. Lichtenberg, Discharges and Materials Processing Principles of Plasma Discharges and Materials, 2005. doi:10.1007/s13398-014-0173-7.2.

To increase the mean free path of the activated species and thus increase the deposition efficiency in the vias, it is necessary to increase the plasma power, increase the species retention time (thus reduce the flows) and reduce pressure, as well as the excitation frequency (plasma frequency).

The reduction in the plasma excitation frequency is obtained at the expense of the deposition quality. To favour a sufficient deposition quality and the mean free path, two distinct sources have been used, i.e. a first high frequency source (for the deposition quality) and a second low frequency source (for the mean free path).

The low frequency source also has the advantage of favouring the generation of ions, unlike the high frequency source which mainly favours the creation of electrons.

Figure 2:
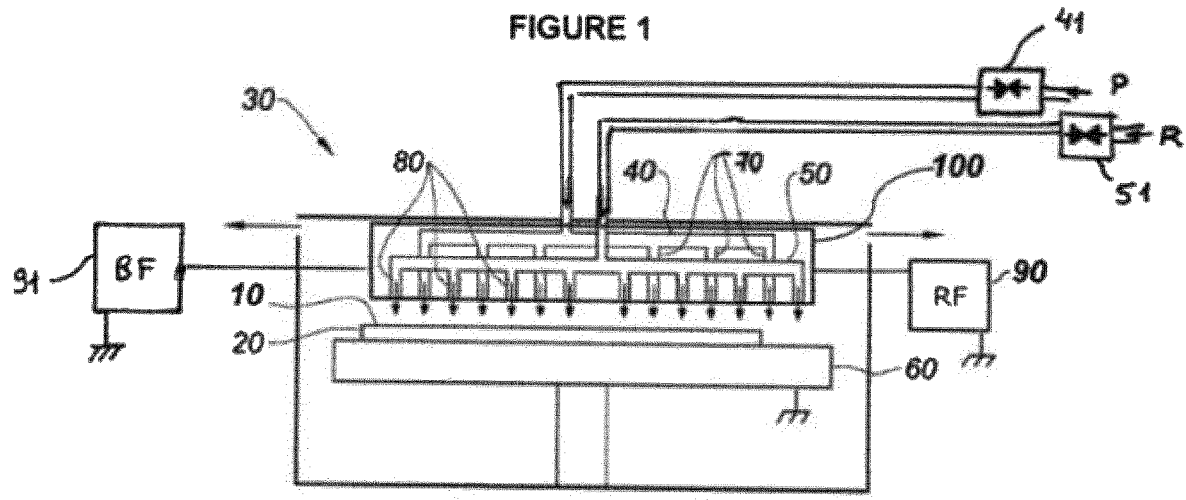
FIG. 2 is a schematic diagram of the deposition chamber used in the pulsed CVD reactor according to the invention.

With reference to FIG. 2, a pulsed CVD reactor according to the invention is based on a structure as disclosed in document WO2009136019.

The reactor comprises an enclosure 30, or a deposition chamber 30, with a substrate carrier 60 able to receive a substrate 20. Such substrate 20 can be deposited onto the substrate carrier 60, so as to have a free surface 10 whereon a treatment, such as the deposition of a layer or an etching operation can be carried out.

The free surface 10 of the substrate 20 is positioned opposite a chemical species injection system 100, or «injection shower» 100. The injection system 100 comprises a first injection path 40 and a second injection path 50 which is different from the first injection path 40. One system for injecting 100 chemical species which can be used in the present invention is disclosed in the patent application WO2009136019.

The first injection path 40 may be used for injecting one first chemical species, and the second injection path 50 may be used for injecting one second chemical species or vice versa.

The input of the first chemical species, for instance a precursor P, in the first injection path 40 is controlled by a first valve 41, of the ALD type, whereas the input of the second chemical species, for example a reactant R, is controlled by a second valve 51, also of the ALD type.

The two valves 41, 51 enable a very quick opening/closing to be able to inject the reactive species as separated time pulses.

The first injection path 40 comprises a first plurality of through-channels 70 of the injection system 100.

The second injection path 50 comprises a second plurality of through-channels 80 of the injection system 100.

The ends of the channels of the first plurality of channels 70 and of the second plurality of channels 80 are positioned opposite the free surface 10 of the substrate 20.

The channels of the first plurality of channels 70 and of the second plurality of channels 80 can be regularly distributed in the injection system. The regular distribution of the channels of the first plurality of channels 70 and of the second plurality of channels 80 makes it possible to improve the uniformity of the layer formed on the free surface 10 of the substrate 20.

Such regular distribution is obtained by maintaining a predetermined distance between the channels of the first plurality of channels 70 as well as between the channels of the second plurality of channels 80 which results in an equidistant distribution pattern. Such distribution may be triangular for the two channel types in order to optimize the use of space in the plane opposite the free surface 10.

The injection system comprises a heating system (not shown) which makes it possible to inject chemical species along the first injection path 40 and the second injection path 50, in a gaseous condition and at a predetermined temperature.

The substrate carrier 60 also comprises a heating system (not shown) intended to heat the substrate 20.

A gas discharge system (not shown) is positioned in the deposition chamber 30 to discharge chemical species which have not reacted on the free surface 10 of the substrate 20.

The pulsed CVD reactor further comprises an electrical generator HF 90 which makes it possible to generate a high frequency plasma of the first chemical species and/or of the second chemical species in the deposition chamber 30, and an electrical generator LF 91 which makes it possible to generate a low frequency plasma of the first chemical species and/or of the second chemical species in the deposition chamber 30.

The two electrical generators 90, 91 are connected to the double channel injection shower 100 so as to enable applying a respectively high frequency (between 12 and 15 MHz) and low frequency (between 100 and 600 kHz) electrical potential, specifically at the ends of the channels of the first plurality of channels 70 and the second plurality of channels 80. The substrate 20 is electrically polarized to the reference (mass or ground) potential of the device through the substrate carrier 60. An electrical field able to generate plasma can thus be created between the injection shower 100 and the substrate 20, directly opposite the free surface 10 of the substrate 20.

The elements composing the plasma chain (generator, conductive wires, contacts, electrodes) are preferably poorly resistive, so that a LF/HF plasma power ratio above 1 can be used. The lower resistivity is, the more easily can a low power plasma be lit, which makes it possible to obtain a stable double frequency plasma having a limited HF power. A set of parameters as follows can be used to optimize the implementing of the deposition method presenting a low frequency (LF)/high frequency (HF) plasma power ratio greater than 1:

Pressure in the deposition chamber ranging from 500 mTorr to 2 Torr.

A flow of precursor ranging from 20 to 100 mgm.

A total flow of species of less than 1,000 sccm.

It should be noted that temperature is not a parameter affecting the method according to the invention. Temperature in the deposition chamber can, for instance, vary from 50 to 400° C.

Preferably, the low frequency (LF) and high frequency (HF) plasma power are selected such that the low frequency (LF)/high frequency (HF) plasma power ratio is greater than 1.2, or even preferably greater than 1.5, such as for example equal to 2.

Figure 3:
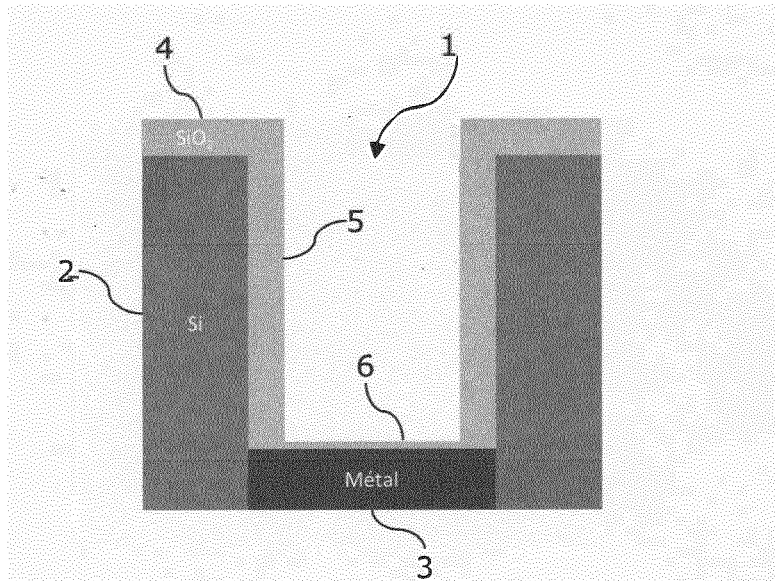
FIG. 3 schematically shows a sectional view of a via processed with the method according to the invention.

Referring to FIG. 3, a via 1 has been processed with the deposition method according to the invention.

A via (or «Through Silicon Via», TSV) is an element well known to the persons skilled in the art. This generally relates to an opening (a hole) which extends through a substrate such as silicon. Such hole may be a through-hole or not, in which case the depth thereof is smaller than the thickness of the substrate. Generally speaking, such hole has an aspect ratio (the ratio of depth to width) above 5:1, or even above 10:1.

A via can, for instance, be intended to set an electrical connection between two component layers through the substrate. To set such an electrical connection, a thin layer of dielectric material is usually deposited onto the opposing walls of the hole (or the via), and same is then filled with an electrically conductive material, such as copper. A conductive material (generally titanium nitride or tantalum nitride) layer is added, i.e. a layer which acts as a barrier to copper diffusion.

Depositing a dielectrical layer onto the walls of vias (or any other structures) which have a significant aspect ratio (or which are narrow and deep) using a CVD type method is difficult. As a matter of fact, the material tends to form differently, depending on the hole depth. Now, to ensure a sufficient electrical insulation, it is important to obtain a deposition with a good quality and a good conformality, i.e. a deposited layer having a homogeneous or constant enough thickness through the via or the structure.

The via 1 as shown in FIG. 3 has thus been made within a silicon substrate 2 and has inner walls and a bottom 3 which has previously been closed using a metallic material.

The deposition method according to the invention enables to form a silicon dioxide (SiO2) layer onto the upper edge (layer 4), onto the inner wall (layer 5) and onto the bottom 3 of the via 1 (layer 6).

As a non-restrictive example, a SiO2 layer with a thickness of 100 nm can be obtained on the surface of the sample, on the upper edge (layer 4) and on the vertical walls (layer 5) of the via and eventually with a thickness of 15 nm on the bottom (layer 6) of the via 1, can thus be obtained above the metal present before the deposition of the insulating material.

Figure 4:
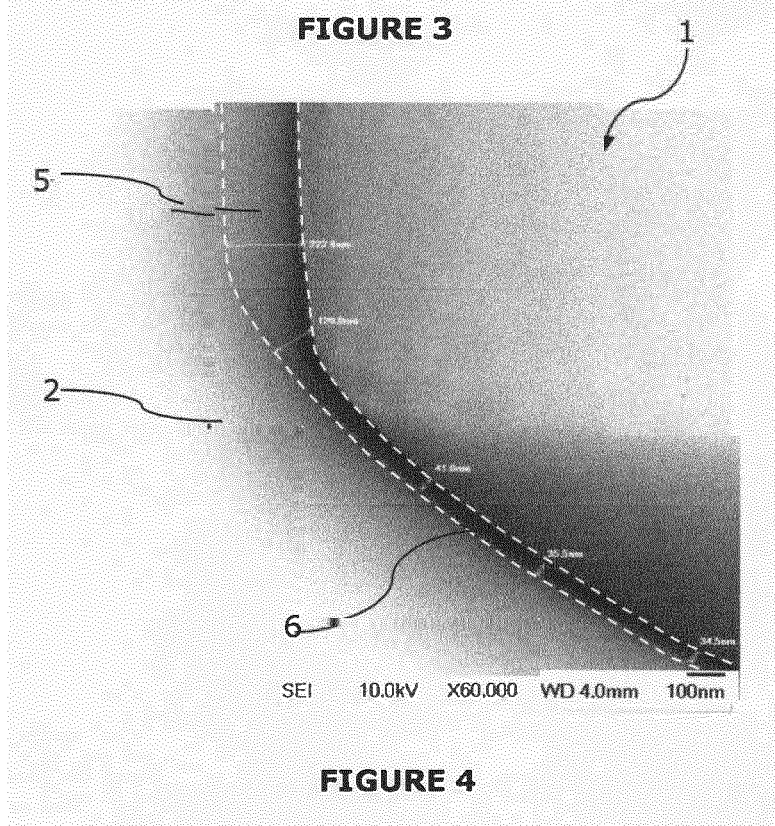
FIG. 4 shows a sectional view of a via processed with the method according to the invention, obtained with a scanning electron microscope.

FIG. 4 shows a sectional view of another via 1 processed with the method according to the invention. This view is obtained using a scanning electron microscope.

In this example, the via 1 is made in a silicon substrate 2 only, with no metallic bottom. Conventionally, it has a rounded bottom. A SiO2 layer having a thickness of 223 nm on the vertical wall (layer 5), and with a thickness of the order of 35 nm on the bottom of the via (layer 6) can be noted. It can also be noted that the depositions on the vertical wall and on the bottom have a very different thickness (the deposit on the bottom of the via is thinner than the one on the walls), and a very good thickness uniformity on the facing walls of the via.

The invention can also be used for other depositions than SiO2, provided that such depositions can be made from a plasma-assisted reaction involving two chemical species (precursor and reactant), however.

A non-exhaustive list of depositions which can be made using the method according to the invention is given hereunder:

| | |
|---|---|
| $SiO_2$ | $TEOS/O_2$ |
| $SiO_2$ | $BTBAS/O_2$ |
| SiN | $BTBAS/NH_3$ |
| TiN | $TDEAT/NH_3$ |
| TiCN | $TDEAT/NH_3$—$CH_4$ |
| TaN | $TBTDET/NE_3$ |
| TaCN | $TBTDET/NH_3$—$CH_4$ |
| $Al_2O_3$ | $TMA/O_2$ |
| ZnO | $DEZ/O_2$ |

Materials obtained from precursor/reactant pairs, well known to the persons skilled in the art are thus considered:

The oxides formed from a precursor and an oxidizing gas, such as: silicon dioxide ($SiO_2$) with tetraethyl orthosilicate (TEOS) and oxygen, silicon dioxide ($SiO_2$) with bis(tert-butylamino)silane (BTBAS) and oxygen, aluminum oxide ($Al_2O_3$) with trimethylaluminium (TMA) and oxygen, zinc oxide (ZnO) with diethylzinc (DEZ) and oxygen, Nitrides formed from a precursor and a nitriding gas, such as: silicon nitride (SiN) with bis(tertiarybutylamino)silane and ammonia, titanium carbonitride (TiCN) with tetrakis(diethyl)amino and ammonia or methane, titanium nitride (TiN) with titanium tetrakis(diethyl)amino (TDEAT) and ammonia, tantalum nitride (TaN) with tantalum tris(diethylamido)(tert-butylimido) (TBTDET) and ammonia, tantalum carbonitride (TaCN) with bis(tertiarybutylamino)silane and ammonia or methane.

More generally, a preferred deposition method according to the present description can be implemented for any other material which can be deposited from a metal-organic liquid precursor and a plasma-activated gas.

In this preferred embodiment, the plasma is generated from the two, high and low frequency plasma sources during at least a part of a reactant injection pulse (the second chemical species), and is not generated during the injection of the precursor (the first chemical species). This makes it possible to optimize the energy supply to the system to deposit the layer onto the substrate. As a matter of fact, when the precursor is injected into the deposition chamber, it absorbs a part of the energy supplied by plasma and thus reduces the efficiency thereof.

In this case, the pulse sequences which correspond to the injection of the first chemical species (precursor), the second chemical species (reactant) and to the generation of plasma, respectively, correspond to the first pulse sequence 1, the second pulse sequence 2 and the third pulse sequence 3, respectively as shown in FIG. 1.

As explained above, and for instance:
The respective durations TI1, TI2 and/or TIp of pulses may range from 0.02 s to 5 s, and the respective time intervals D1, D2 and/or Dp between two pulses in one sequence may range from 0.02 s to 10 s;
The respective durations TI1, TI2 and/or TIp of pulses may range from 0.02 s to 1 s, and the respective time intervals D1, D2 and/or Dp between two pulses in one sequence may range from 0.02 s to 1 s;
The respective durations TI1, TI2 and/or TIp of pulses may range from is to 5 s, and the respective time intervals D1, D2 and/or Dp between two pulses in one sequence may range from is to 10 s;

According to other embodiments, it may be advantageous:
To generate plasma for at least a part of one pulse of injection of the precursor, and not to generate plasma during the injection of the reactant; or
To generate plasma for at least a part of one pulse of injection of the precursor, and at least a part of one pulse of injection of the reactant.

As regards the pulsed CVD reactor shown in FIG. 2, the travel time of the first and second chemical species between the chemical species injection system and the free surface 10 of the substrate can be defined as the time required by the first and second chemical species to travel on the distance between the injection system and the free surface 10 of the substrate.

The separate management of the injection of the first and second chemical species according to a phase-shifted mode of said first and second chemical compounds favours the reaction thereof on the free surface of the substrate rather than in the space between the free surface of the substrate and the system of injection, or rather than with other chemical species initially present on the surface of the substrate.

As a matter of fact, when the first chemical species is injected during the duration of one pulse into the deposition chamber through the first injection path, a part thereof reacts with the free surface of the substrate and settles there, and the surplus can be at least partially pumped by the gas discharge system. The first chemical species is then in a smaller amount in the space between the free surface of the substrate and the injection system.

The second chemical species is injected into the deposition chamber as pulses phase-shifted relative to the first chemical species. The reaction rate between the first chemical species and the second chemical species in the space between the free surface of the substrate and the injection system is thus reduced as compared to a sequence of injection of the chemical species in a continuous flow. The second chemical species then preferably reacts with the first species present on the free surface 10 of the substrate.

Such mode of injection of the first and second chemical species is particularly interesting when these are liable to react for a reaction time which is shorter than the above-mentioned travel time.

Moreover, the pressure in the deposition chamber 30 is greater than a predetermined value of for instance 500 mTorr throughout the duration of the process unlike atomic layer deposition (ALD=Atomic Layer Deposition) techniques.

In fact, ALD involves the injection of only one chemical species at a time and requires the chamber to be completely purged before the other chemical species is injected. In the case of the present invention, complex pumping systems and purging steps that slow down the ratesat which layers are deposited on the substrates can be omitted. A process according to the present description does not require the introduction of a purge gas into the deposition chamber, either between pulses of the first and second sequence or during the pulses. The injection of chemical species into the reactor chamber by injection sequences and the sequential generation of plasma thus make it possible to significantly reduce the thermal energy required for the progress of the reaction of the thin layer deposition onto the substrate, and thus to reduce the temperature in the deposition chamber and the substrate carrier. Such reduction in temperature does not affect the progress of the layer forming reaction, and specifically the efficiency (yield, rate, for instance) thereof, since the part of lost thermal energy is supplied by plasma and the total energy supplied to the system remains unchanged, or may even be greater than what could be supplied by heat gain only.

Of course, the invention is not limited to the above-described examples and numerous changes can be made to these examples without leaving the scope of the invention. The various characteristics, shapes, alternative solutions and embodiments of the invention can be associated together in various combinations whenever they are not conflicting or mutually exclusive. More particularly all the alternative solutions and embodiments disclosed above can be combined together.

What is claimed is:
1. A method for depositing a layer of an insulating material onto a plurality of vias on a silicon substrate, comprising:
providing the silicon substrate having the plurality of vias;
placing the silicon substrate having the plurality of vias into a deposition chamber;
a gas-phase injection of a first chemical species comprising a precursor of such insulating material, into the deposition chamber of a chemical vapor deposition reactor, through a first injection path, according to a first pulse sequence;

a gas-phase injection of a second chemical species comprising a reactant adapted to react with such precursor, into the deposition chamber, through a second injection path, according to a second pulse sequence which is phase-shifted relative to the first pulse sequence;

a sequential generation of a plasma of the first reactive chemical species and/or the second reactive chemical species during at least one pulse of at least one of the first and second sequences, with such plasma being generated from a high frequency plasma source; and a low frequency plasma source, with said high frequency and low frequency plasma sources being applied to said first and second injection paths, the low frequency plasma source power on the high frequency plasma source power ratio being above 1, wherein the layer of insulating material is deposited on an upper edge, an inner wall and a bottom of each via of the plurality of vias on the silicon substrate.

2. A method according to claim 1, wherein the layer of insulating material is silicon dioxide.

3. A method according to claim 1, wherein the pressure in the chamber ranges from 500 mTorr to 2 Torr.

4. A method according to claim 1, wherein the precursor flow ranges from 20 mgm to 100 mgm.

5. A method according to claim 1, wherein the total flow of the injected chemical species is below 1,000 sccm.

6. A method according to claim 1, wherein plasma is generated pulse-wise in the deposition chamber during the injection of the first chemical species.

7. A method according to claim 6, wherein plasma is generated pulse-wise in the deposition chamber during the injection of the second chemical species.

8. A method according to claim 7, wherein the duration of each plasma pulse is less than 1 second.

9. A method according to claim 1, wherein the duration of one pulse of the first pulse sequence ranges from 0.02 s to 5 s.

10. A method according to claim 9, wherein the duration of one pulse of the second pulse sequence ranges from 0.02 s to 5 s.

11. A method according to claim 1, wherein the time interval between the first pulse sequence ranges from 0.02 s to 10 s.

12. A method according to claim 11, wherein the time interval between the second pulse sequence ranges from 0.02 s to 10 s.

13. A method according to claim 1, further comprising:
the duration of one pulse of the first pulse sequence ranges from 0.02 s to 5 s;
the duration of one pulse of the second pulse sequence ranges from 0.02 s to 5 s;
the time interval between the first pulse sequence ranges from 0.02 s to 10 s; and
the time interval between the second pulse sequence ranges from 0.02 s to 10 s.

14. A method according to claim 13, wherein the duration of each plasma pulse is less than 1 second.

15. A method according to claim 1, wherein the plasma is generated during the whole duration of one pulse of at least one of the first and second sequences.

16. A method according to claim 1, wherein the precursor comprises at least one of the following compounds: tetraethyl orthosilicate (TEOS), bis(tert-butylamino) silane (BTBAS), bis(di-butylamino)silane (BDBAS), Tetrakis Diethylamido Titane (TDEAT), Tert-Butylimido Tris (DiEthylamino) Tantale (TBTDET), Trimethylaluminum (TMA), diethylzinc (DEZ).

17. A method according to claim 1, wherein the reactant comprises at least one of the following compounds: steam ($H_2O$), dinitrogen oxide ($N_2O$), gaseous oxygen ($O_2$), ammonia ($NH_3$), methane ($CH_4$).

18. A method according to claim 1, wherein the high frequency plasma source presents a frequency comprising between 12 and 15 MHz and the low frequency plasma source presents a frequency comprising between 100 and 600 kHz.

* * * * *